United States Patent
Chang et al.

(10) Patent No.: US 12,324,194 B2
(45) Date of Patent: Jun. 3, 2025

(54) SOURCE/DRAIN ENGINEERING FOR FERROELECTRIC FIELD EFFECT TRANSISTORS

(71) Applicant: TAIWAN SEMICONDUCTOR MANUFACTURING COMPANY LTD., Hsinchu (TW)

(72) Inventors: Chih-Yu Chang, New Taipei (TW); Chun-Chieh Lu, Taipei (TW); Yu-Chien Chiu, Hsinchu County (TW); Ya-Yun Cheng, Taichung (TW); Yu-Ming Lin, Hsinchu (TW); Sai-Hooi Yeong, Hsinchu County (TW); Hung-Wei Li, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 433 days.

(21) Appl. No.: 17/748,076

(22) Filed: May 19, 2022

(65) Prior Publication Data
US 2023/0378350 A1    Nov. 23, 2023

(51) Int. Cl.
| | |
|---|---|
| H01L 29/78 | (2006.01) |
| H01L 29/66 | (2006.01) |
| H01L 29/786 | (2006.01) |
| H10D 30/67 | (2025.01) |
| H10D 30/69 | (2025.01) |
| H10D 64/68 | (2025.01) |
| H10D 99/00 | (2025.01) |

(52) U.S. Cl.
CPC ....... *H10D 30/701* (2025.01); *H10D 30/6713* (2025.01); *H10D 30/6755* (2025.01); *H10D 30/6757* (2025.01); *H10D 64/689* (2025.01); *H10D 99/00* (2025.01)

(58) Field of Classification Search
CPC ............. H01L 29/516; H01L 29/78391; H01L 29/78696
See application file for complete search history.

(56) References Cited

U.S. PATENT DOCUMENTS

| | | | | |
|---|---|---|---|---|
| 2012/0319112 A1* | 12/2012 | Cho | .................... | H01L 29/7869 257/E29.273 |
| 2021/0327705 A1* | 10/2021 | Chang | ............... | H01L 21/76802 |
| 2021/0367080 A1* | 11/2021 | Lee | .................... | H01L 29/6684 |
| 2022/0344513 A1* | 10/2022 | Huang | ................. | H01L 29/516 |
| 2024/0038898 A1* | 2/2024 | Jintyou | ............. | H01L 29/78648 |

* cited by examiner

*Primary Examiner* — Victoria K. Hall
(74) *Attorney, Agent, or Firm* — WPAT LAW; Anthony King

(57) ABSTRACT

A semiconductor device and a method for manufacturing the semiconductor device are provided. The semiconductor device comprises a gate, a ferroelectric layer disposed on the gate; a first channel layer disposed on the ferroelectric layer, a second channel layer disposed on the ferroelectric layer, and source and drain regions disposed on the first channel layer. The first channel layer includes a first thickness and the second channel layer includes a second thickness. A ratio of the first thickness and the second thickness is less than 3/5.

21 Claims, 17 Drawing Sheets

SOURCE/DRAIN ENGINEERING FOR FERROELECTRIC FIELD EFFECT TRANSISTORS

BACKGROUND

The present disclosure relates, in general, to semiconductor devices and methods for manufacturing the same. Specifically, the present disclosure relates to a semiconductor device for a ferroelectric field effect transistor (FeFET).

In traditional oxide semiconductor (OS) FeFETs, a programming effect (applied by a positive gate voltage) is generally larger than an erasing effect (applied by a negative gate voltage). This is because an OS channel layer of an OS FeFET would be in accumulation (i.e., on-state) during the programming operation and in depletion (i.e., off-state) during the erasing operation, which would lead to an additional voltage drop on the depleted OS channel layer during the erasing operation, rather than a total drop on a ferroelectric layer of the OS FeFET.

In a back-gated OS-FeFET, the erasing effect on the ferroelectric layer (at channel region) is affected by the fringing field from source and drain regions due to the depletion (off-state) of the OS channel layer during the erasing operation, such that the programming effect is generally larger than the erasing effect with respect to the back-gated OS-FeFET.

The depletion of the OS channel layer may cause an erasing voltage drop on the OS channel layer, which degrades the erasing effect. To enlarge the erasing effect in order to enlarge the memory window, one approach is to make the OS channel layer have a high carrier concentration to reduce depletion width. However, such high carrier concentration of the OS channel layer may lead to a negative threshold voltage ($V_t$) and a high off current ($I_{off}$) in the back-gated OS-FeFET.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

DETAILED DESCRIPTION

Figure 1A:
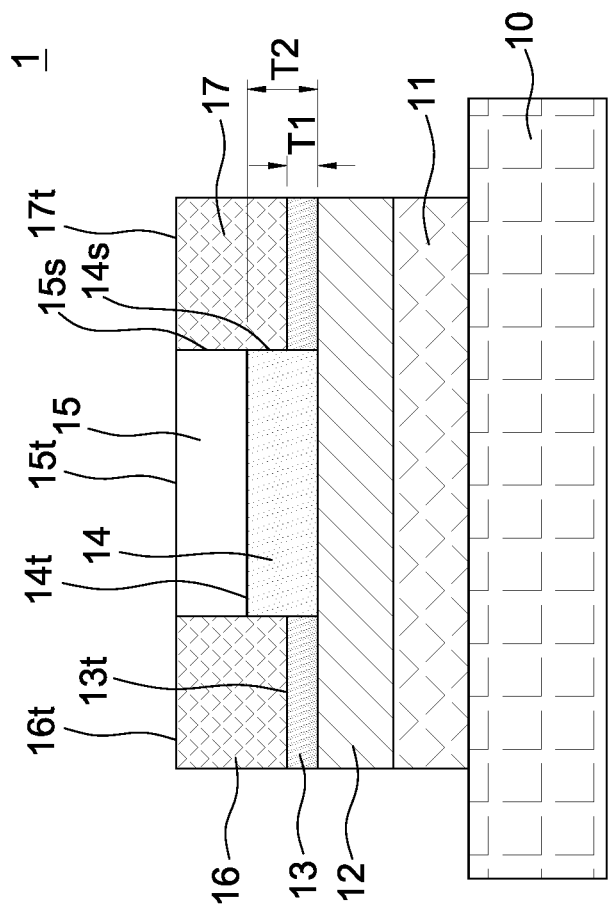
FIG. 1A is a cross-sectional view of a semiconductor device, in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although terms such as "first," "second" and "third" describe various elements, components, regions, layers and/or sections, these elements, components, regions, layers and/or sections should not be limited by these terms. These terms may only be used to distinguish one element, component, region, layer or section from another. Terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the like thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1A is a cross-sectional view of a semiconductor device 1 in accordance with some embodiments of the present disclosure. The semiconductor device 1 includes a substrate 10, a gate electrode 11, a ferroelectric layer 12, a channel layer 13, a channel layer 14, a protection layer 15, source region 16, and drain region 17. The semiconductor device 1 may be a ferroelectric field effect transistor (FeFET). In some embodiments, the semiconductor device 1 is an oxide semiconductor (OS) FeFET. The semiconductor device 1 is a back-gated OS FeFET.

The substrate 10 may be a supporting element. The substrate may be a dielectric substrate. The dielectric substrate 10 may include multiple dielectric layers formed of the same or different dielectric materials. In some embodiments, the dielectric substrate is formed with metallization layers or conductive patterns (not shown) embedded therein for electrically connecting the semiconductor device 1 with the other devices or power supplies.

The substrate 10 may be a semiconductor substrate (e.g., a wafer). The semiconductor substrate 10 may be a silicon substrate. Alternatively, the substrate 10 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP, or combinations thereof. In other embodiments, the substrate 10 may include, for example, an insulating layer such as a $SiO_2$ or a $Si_3N_4$ layer in addition to a semiconductor substrate portion. Thus, the term substrate 10 also includes silicon-on-glass, silicon-on-sapphire substrates. Also, the substrate 10 may be any other base on which a layer is formed, for example a glass or metal layer. Accordingly, the substrate 10 may be a wafer such as a blanket wafer or may be a layer applied to another base material, e.g., an epitaxial layer grown onto a lower layer. In some embodiments, the substrate 10 may be removed.

The gate electrode 11 is disposed on the substrate 10. In some embodiments, the material of the gate electrode 11 may include a metal, a metallic compound, metal oxide, metal nitride, metal carbide or a silicide, or combinations thereof. For example, the materials of the gate electrode 11 may include tungsten (W), ruthenium (Ru), molybdenum (Mo), tantalum (Ta), titanium (Ti), alloys thereof, nitrides thereof (such as TiN, TaN, or WN), carbide thereof or combinations thereof. In some embodiments, the gate electrode 11 has a thickness in a range from about 20 nm to about 100 nm depending on design requirements. In some embodiments, a barrier layer (which is not shown here) and/or an etch stop layer (not shown) may be formed on the substrate 10 before the formation of the gate electrode 11.

The ferroelectric layer 12 is disposed on the gate electrode 11. The ferroelectric layer 12 is in contact with the gate electrode 11. In some embodiments, the material of the ferroelectric layer 12 may include $HfO_2$, $HfZrO_2$, or $HfO_2$ doped with zirconium (Zr), silicon (Si), lanthanum (La), yttrium (Y), aluminum (Al), strontium (Sr), germanium (Ge), or the combinations thereof. In some embodiments, the material of the ferroelectric layer 12 includes lead zirconate titanate (PZT), aluminum nitride (AlN) or aluminum scandium nitride (AlScN).

The channel layer 13 is disposed on a top surface of the ferroelectric layer 12. The channel layer 13 has a top surface 131. The channel layer 13 has a first carrier concentration. In some embodiments, the first carrier concentration of the channel layer 13 is in a range from approximately $10^{20}$ cm$^{-3}$ to approximately $10^{21}$ cm$^{-3}$. The channel layer 13 may be an n-type channel layer. The channel layer 13 may be an n$^+$-type channel layer. The channel layer 13 has a thickness T1. The thickness T1 of the channel layer 13 may be less than or equal to 7 nm. In some embodiments, the thickness T1 of the channel layer 13 may be in a range from about 3 nm to about 5 nm. The thickness T1 of the channel layer 13 may be in a range from about 3 nm to about 7 nm. The thickness T1 of the channel layer 13 may be in a range from about 3 nm to about 10 nm. The thickness T1 of the channel layer 13 may be adjusted depending on design requirements.

The channel layer 14 is disposed on the top surface of the ferroelectric layer 12. The channel layer 14 has a top surface 14$t$ and a lateral surface 14$s$ connected to the top surface 14$t$. The channel layer 14 has a second carrier concentration. The second carrier concentration of the channel layer 14 is less than the first carrier concentration of the channel layer 13. In some embodiments, the second carrier concentration of the channel layer 14 is in a range from approximately $10^{16}$ cm$^{-3}$ to approximately $10^{17}$ cm$^{-3}$. The channel layer 14 may be an n-type channel layer. The channel layer 14 has a thickness T2. The thickness T2 of the channel layer 14 may be greater than or equal to 10 nm. In some embodiments, the thickness T2 of the channel layer 14 may be in a range from about 10 nm to about 20 nm. The thickness T2 of the channel layer 14 may be in a range from about 10 nm to about 25 nm. The thickness T2 of the channel layer 14 may be in a range from about 5 nm to about 30 nm. The thickness 12 of the channel layer 14 may be adjusted depending on design requirements. In some embodiments, a ratio of the thickness T1 of the channel layer 13 and the thickness 12 of the channel layer 14 is less than ⅗.

The channel layer 13 and the channel layer 14 may include or may be an oxide semiconductor (OS) layer. In some embodiments, the channel material of the channel layer 13 or the channel layer 14 may include an indium-containing or gallium-containing metal oxide semiconductor material (e.g., indium-gallium-zinc oxide (IGZO), indium-zinc oxide (IZO), indium-tin oxide (ITO) or indium tungsten oxide (IWO)), a zinc-containing metal oxide semiconductor material (e.g., zinc oxide (ZnO), gallium-zinc oxide (GZO), zinc-tin oxide (ZTO) or combinations thereof). The material of the channel layer 13 is the same as the material of the channel layer 14. In some embodiments, the first carrier concentration of the channel layer 13 and the second carrier concentration of the channel layer 14 are defined by oxygen vacancies. The oxygen vacancies of the channel layer 13 are higher than the oxygen vacancies of the channel layer 14.

The channel layer 13 and the channel layer 14 are in contact with the top surface of the ferroelectric layer 12. The channel layer 14 is surrounded by the channel layer 13. The channel layer 14 is in contact with the channel layer 13. The lateral surface 14$s$ of the channel layer 14 is partially covered by the channel layer 13.

The source region 16 includes a top surface 16$t$. The source region 16 is disposed directly above the channel layer 13. The source region 16 is in contact with the channel layer 13. The source region 16 is laterally in contact with the channel layer 14. The source region 16 may be a conductive pattern. The source region 16 may be a metal pattern. The channel layer 13 provides a highly effective conductive contact for the source region 16 due to its high carrier concentration.

The drain region 17 includes a top surface 17t. The top surface 16t of the source region 16 and the top surface 17t of the drain region 17 are substantially coplanar with each other. The drain region 17 is disposed directly above the channel layer 13. The drain region 17 is in contact with the channel layer 13. The drain region 17 is laterally in contact with the channel layer 14. The drain region 17 may be a conductive pattern. The drain region 17 may be a metal pattern. The channel layer 13 provides a highly effective conductive contact for the drain region 17 due to its high carrier concentration. The source region 16 and the drain region 17 are covered in a projective area of the gate electrode 11.

In some embodiments, the material of the source region 16 or the drain region 17 may include tungsten (W), molybdenum (Mo), ruthenium (Ru), titanium nitride (TiN), copper (Cu), aluminum (Al), or alloys thereof.

The channel layer 14 extends between the source region 16 and the drain region 17. The channel layer 13 and the channel layer 14 provide a transport path between the source region 16 and the drain region 17.

The protection layer 15 is disposed directly above the channel layer 14. The protection layer 15 is in contact with the top surface 14t of the channel layer 14. The protection layer 15 may protect the channel layer 14 without damage. In some embodiments, the material of the protection layer 15 may include silicon oxide, silicon nitride, silicon oxynitride, or a low-k dielectric material. The protection layer 15 includes a top surface 15t and a lateral surface 15s connected to the top surface 15t. The top surface 15t of the protection layer 15, the top surface 16t of the source region 16, and the top surface 17t of the drain region 17 are substantially coplanar. The lateral surface 15s of the protection layer 15 and the lateral surface 14s of the channel layer 14 are substantially coplanar.

Figure 1B:
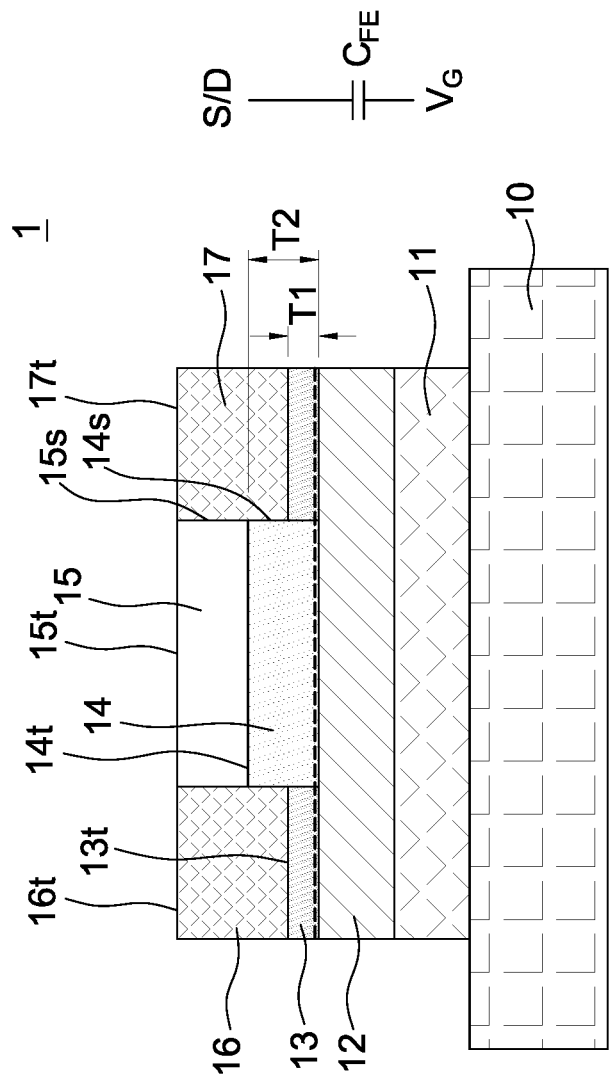
FIG. 1B is a cross-sectional view of a semiconductor device, in accordance with some embodiments of the present disclosure.

FIG. 1B is a cross-sectional view of the semiconductor device 1 under a programming operation in accordance with some embodiments of the present disclosure.

During a programming operation, the gate electrode 11 of the semiconductor device 1 is applied with a positive gate voltage (i.e., a programming voltage>0 volts). In some embodiments, the source region 16 and the drain region 17 may be kept grounded (e.g., the source and drain voltage being equal to zero volts). The positive gate voltage may be in a range from approximately 0V to approximately 5V.

The channel layer 13 may have a channel region adjacent to the top surface of the ferroelectric layer 12 during the programming operation. An inversion channel may be formed in the channel region of the channel layer 13. High density charges may be induced in the inversion channel. The channel region of the channel layer 13 may provide a conductive path for electron transmission. Electrons may accumulate in the channel region of the channel layer 13.

The channel layer 14 may have a channel region adjacent to the top surface of the ferroelectric layer 12 during the programming operation. An inversion channel may be formed in the channel region of the channel layer 14. High density charges may be induced in the inversion channel. The channel region of the channel layer 14 may provide a conductive path for electron transmission. Electrons may accumulate in the channel region of the channel layer 14. It is easier for electrons to accumulate in the channel region of the channel layer 13 than in the channel region of the channel layer 14.

Electrons would accumulate at an interface between the ferroelectric layer 12 and the channel layers 13, 14. Electrons would accumulate in the inversion channels of the channel layers 13, 14. Electrons transmit from the source region 16 to the drain region 17 through the inversion channels of the channel layers 13, 14. The channel layer 13 provides a highly effective conductive contact for the source region 16 and the drain region 17 due to its high carrier concentration. The channel layer 13 also provides a highly effective conductive inversion channel for electron accumulation and transmission. Accordingly, a high on-current ($I_{on}$) of the semiconductor device 1 may be obtained due to the low resistance of the channel layer 13.

In addition, since the second carrier concentration of the channel 14 may be less than $10^{17}$ cm$^{-3}$, which is less than the first carrier concentration of the channel 13, a relatively high threshold voltage (Vi) of the semiconductor device 1 may be obtained. A positive threshold voltage may be in a range from approximately 0.1V to approximately 3V.

During the programming operation, the voltage drop of the gate voltage would entirely cross the ferroelectric layer 12. A ferroelectric capacitance $C_{FE}$ is obtained.

Figure 1C:
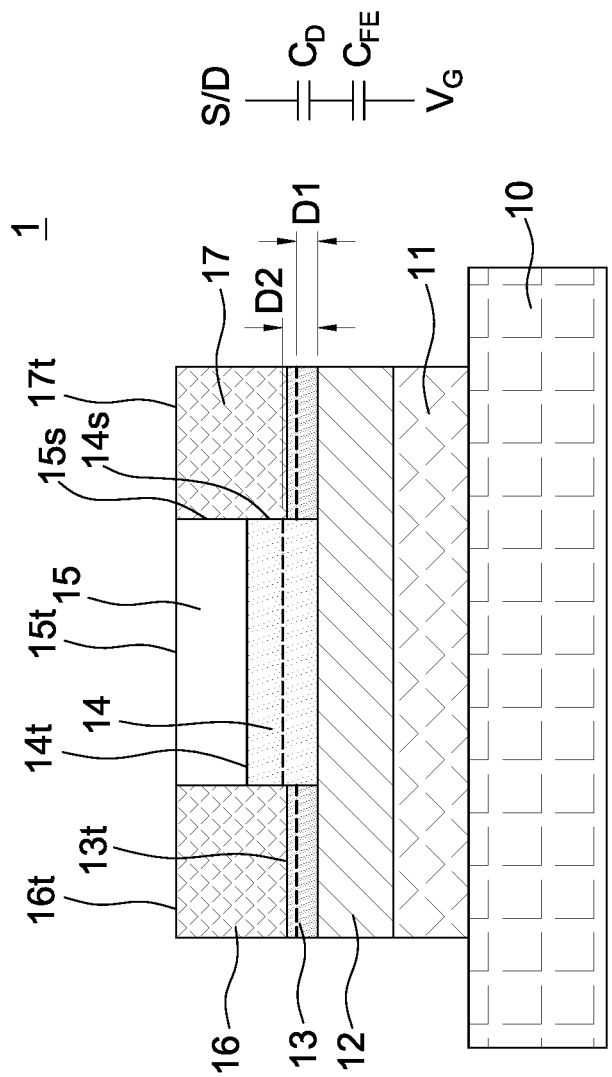
FIG. 1C is a cross-sectional view of a semiconductor device, in accordance with some embodiments of the present disclosure.

FIG. 1C is a cross-sectional view of the semiconductor device 1 under an erasing operation in accordance with some embodiments of the present disclosure. As used herein, the term "erase" or "erasing operation" refers to the operation of setting a high-$V_t$ state in an n-channel FeFET.

During an erasing operation, the gate electrode 11 of the semiconductor device 1 is applied with a negative gate voltage (i.e., an erasing voltage<0 volts). In some embodiments, the source region 16 and the drain region 17 may be kept grounded (e.g., zero volts). The negative gate voltage may be in a range from approximately 0V to approximately −5V. An electric field from the source and drain regions 16, 17 to the gate electrode 11 pass through the ferroelectric layer 12 and the channel layer 13. The channel layer 14 would be affected by a fringing electric field at the same time. Depletion regions would be formed adjacent to an interface between the ferroelectric layer 12 and the channel layers 13, 14. The depletion regions would be formed in the channel layers 13, 14. There would be no charges in the depletion regions of the channel layers 13, 14. Since the main electric field passes through the channel layer 13 and the fringing field passes through the channel layer 14, the following discussion with respect to the electric field mainly focuses on the channel 13.

A depletion width of a depletion region in a channel layer would depend on a carrier concentration of the channel layer. In some embodiments, the depletion region formed in the channel layer 13 has a depletion width D1. The depletion region formed in the channel layer 14 has a depletion width D2. The depletion width D2 of the depletion region in the channel layer 14 is greater than the depletion width D1 of the depletion region in the channel layer 13. The depletion width D1 of the depletion region in the channel layer 13 may be less than 7 nm under the condition that the first carrier concentration of the channel layer 13 is greater than $10^{20}$ cm$^{-3}$. In the case that the thickness T1 of the channel layer 13 is equal to or less than 7 nm, and the depletion width D1 is equal to the thickness T1, the channel layer 13 would be completely depleted.

During the erasing operation, the electrical field from the source and drain regions 16, 17 would cross the ferroelectric layer 12 and the channel layer 13 so as to obtain a ferroelectric capacitance $C_{FE}$ and a depletion capacitance $C_D$. The voltage drop of the gate voltage would cross the ferroelectric layer 12 and the channel layer 13. Since the thickness of the channel layer 13 is relatively thin, the depletion capacitance $C_D$ would be relatively large. In addition, the channel layer 13 includes a relatively high carrier concentration, such that the depletion capacitance $C_D$ may be further adjusted to be large. Accordingly, a relatively high voltage drop of the gate voltage crosses the ferroelectric layer 12 and a relative low voltage drop of the gate voltage crosses the channel layer 13 such that a memory window of the semiconductor device 1 can be obtained.

Figure 1D:
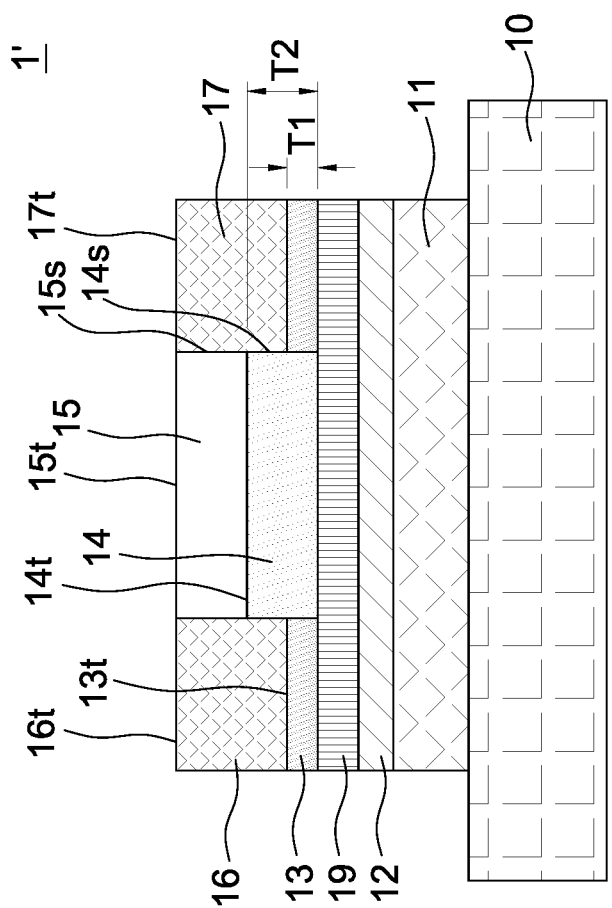
FIG. 1D is a cross-sectional view of a semiconductor device, in accordance with some embodiments of the present disclosure.

FIG. 1D is a cross-sectional view of a semiconductor device 1' in accordance with some embodiments of the present disclosure. The structure of the semiconductor device 1' is similar to the structure of the semiconductor device 1 except that the semiconductor device 1' includes a gate dielectric layer 19.

The ferroelectric layer 12 and the gate dielectric layer 19 form a dielectric stack between the gate electrode 11 and the channel layers 13, 14. The gate dielectric layer 19 is disposed on the ferroelectric layer 12. The gate dielectric layer 19 is disposed between the ferroelectric layer 12 and the channel layer 13. The gate dielectric layer 19 is disposed between the ferroelectric layer 12 and the channel layer 14. The gate dielectric layer 19 is in contact with the ferroelectric layer 12 and the channel layers 13, 14. The gate dielectric layer 19 may enhance isolation between the gate electrode 11 and the channel layers 13, 14 so as to decrease a gate leakage current from the gate electrode 11 during the programming operation.

The gate dielectric layer 19 may include high density plasma (HDP) oxide (e.g., a layer of oxide formed by an HDP chemical vapor deposition) to prevent the semiconductor device 1' from gate leakage current. In some embodiments, the material of the gate dielectric layer 19 may include silicon oxide, aluminum oxide, silicon oxynitride, silicon nitride, silicon carbon nitride (SiCN), silicon oxycarbonitride (SiOCN) or the like. The gate dielectric layer 19 may be formed by a plasma-enhanced chemical vapor deposition (PECVD) process and/or other suitable deposition or oxidation processes. In some embodiments, the material of the gate dielectric layer 19 may include a high dielectric constant (K) material, such as $SiO_2$, $GeO_2$, $HfO_2$, $ZrO_2$, $HfZrO_2$, $Ga_2O_3$, $Gd_2O_3$, $TaSiO_2$, $Al_2O_3$, or $TiO_2$ or combinations thereof.

In some embodiments, a thickness of the gate dielectric layer 19 may be greater or less than a thickness of the ferroelectric layer 12. The thickness of the gate dielectric layer 19 may be equal to the thickness of the ferroelectric layer 12. The materials and the thicknesses of the ferroelectric layer 12 and the gate dielectric layer 19 may be finely tuned to obtain a minimized gate leakage current.

Figure 2:
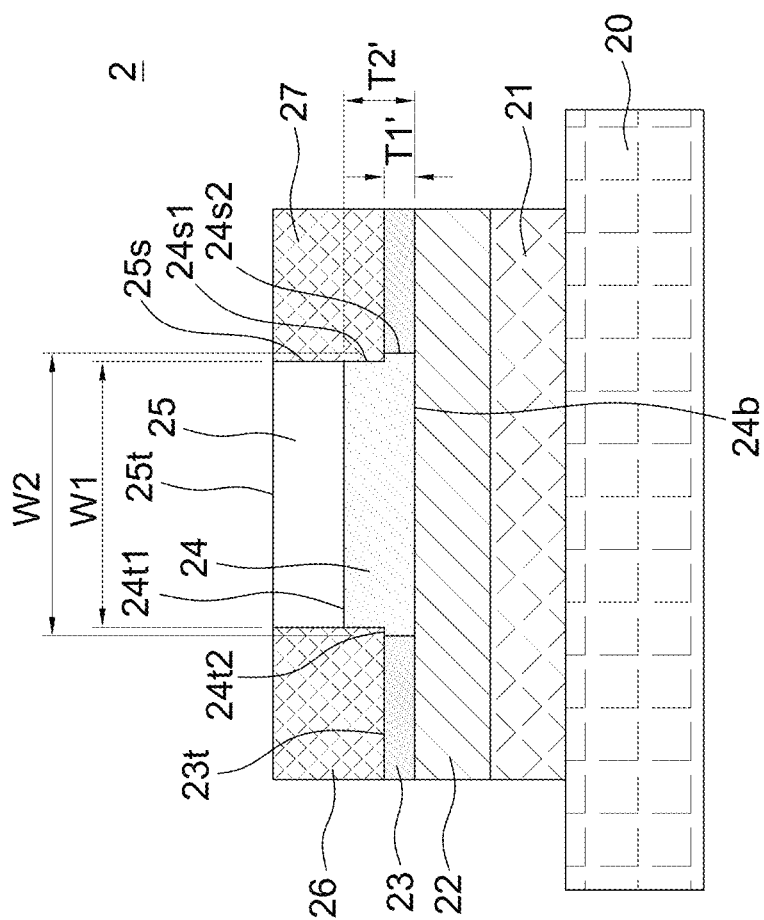
FIG. 2 is a cross-sectional view of a semiconductor device, in accordance with some embodiments of the present disclosure.

FIG. 2 is a cross-sectional view of a semiconductor device 2 in accordance with some embodiments of the present disclosure. The semiconductor device 2 includes a substrate 20, a gate electrode 21, a ferroelectric layer 22, a channel layer 23, a channel layer 24, a protection layer 25, source region 26, and drain region 27. The semiconductor device 2 may be a FeFET. In some embodiments, the semiconductor device 2 is an OS FeFET. The semiconductor device 2 is a back-gated OS FeFET. The structure of the semiconductor device 2 is similar to the structure of the semiconductor device 1 except for the channel layers 23, 24.

The channel layer 23 is disposed on the ferroelectric layer 22. The channel layer 23 has a top surface 23t. A first carrier concentration of the channel layer 23 is the same as that of the channel layer 13. A material of the channel layer 23 is the same as that of the channel layer 13. The channel layer 23 has a thickness T1'. The thickness T1' of the channel layer 23 may be less than or equal to 7 nm. In some embodiments, the thickness T1' of the channel layer 23 may be in a range from about 3 nm to about 5 nm. The thickness T1' of the channel layer 23 may be in a range from about 3 nm to about 7 nm. The thickness T1' of the channel layer 23 may be in a range from about 3 nm to about 10 nm. The thickness T1' of the channel layer 23 may be adjusted depending on design requirements.

The channel layer 24 is disposed on the top surface of the ferroelectric layer 22. The channel layer 24 has a first top surface 24t1 and a first lateral surface 24s1 connected to the first top surface 24t1. The first lateral surface 24s1 is in contact with the source region 26 or the drain region 27. The first top surface 24t1 has a first width W1. A portion of the channel layer 24 under the source and drain regions 26, 27 is a diffusion portion. The diffusion portion of the channel layer 24 has a second top surface 24t2 and a second lateral surface 24s2. The second lateral surface 24s2 is in contact with the channel layer 23. The channel layer 24 has a bottom surface 24b opposite the second top surface 24t2. The second lateral surface 24s2 connects the second top surface 24t2 to the bottom surface 24b. The bottom surface 24b has a second width W2. The first width W1 is less than the second width W2. The channel layer 24 has a step structure. The second carrier concentration of the channel layer 24 is the same as that of the channel layer 14. A material of the channel layer 24 is the same as that of the channel layer 14.

The channel layer 24 has a thickness T2'. The thickness T2' of the channel layer 24 may be greater than or equal to 10 nm. In some embodiments, the thickness T2' of the channel layer 24 may be in a range from about 10 nm to about 20 nm. The thickness T2' of the channel layer 24 may be in a range from about 10 nm to about 25 nm. The thickness T2' of the channel layer 24 may be in a range from about 10 nm to about 30 nm. The thickness T2' of the channel layer 24 may, be adjusted depending on design requirements. In some embodiments, a ratio of the thickness of the channel layer 23 and the thickness T2' of the channel layer 24 is less than ⅗.

The protection layer 25 includes a top surface 25t and a lateral surface 25s connected to the top surface 25t. The lateral surface 25s of the protection layer 25 and the first lateral surface 24s1 of the channel layer 24 are substantially coplanar. The second lateral surface 24s2 of the channel layer 24 shifts a distance from the first lateral surface 24s1 of the channel layer 24.

FIGS. 3A through 3F illustrate some embodiments of a method of manufacturing a semiconductor device 1 according to some embodiments of the present disclosure. Various figures have been simplified to more clearly present aspects of the present disclosure.

Figure 3A:
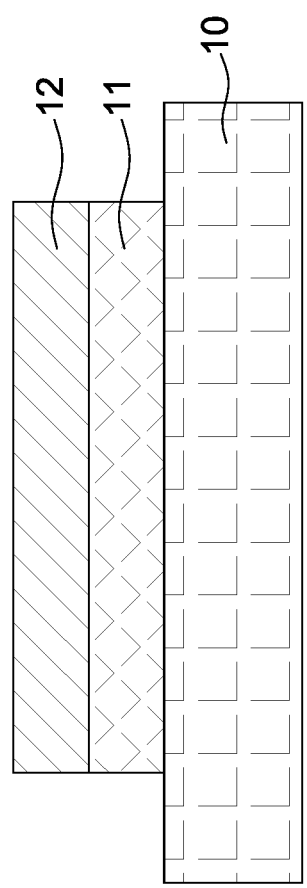
FIG. 3A to FIG. 3F illustrates a method of manufacturing a semiconductor device according to some embodiments of the present disclosure.

Referring to FIG. 3A, the method for manufacturing the semiconductor device 1 includes providing a substrate 10. The substrate 10 may be a silicon substrate. Alternatively, the substrate 10 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP, or combinations thereof. The substrate 10 may include silicon-on-glass, silicon-on-sapphire substrates. Also, the substrate 10 may be any other base on which a layer is formed, for example a glass or metal layer.

A gate electrode 11 is formed on the substrate 10. A ferroelectric layer 12 is subsequently deposited on the gate electrode 11. The formation of the gate electrode 11 includes forming a conductive layer (not shown) on the substrate 10, and then the conductive layer is patterned as the gate electrode 11. The gate electrode 11 may be formed through one or more operations of CVD, atomic layer deposition (ALD), physical vapor deposition (PVD), plating or other suitable methods. The patterned operation may include a lithographic operation and an etching operation. The etching operation may be wet etching or dry etching.

In some embodiments, the material of the conductive layer includes a metal, a metallic compound, metal oxide, metal nitride, metal carbide or a silicide, or combinations thereof. The materials of the gate electrode LI may include tungsten (W), ruthenium (Ru), molybdenum (Mo), tantalum (Ta), titanium (Ti), alloys thereof, nitrides thereof (such as TiN, TaN, or WN), carbide thereof or combinations thereof. The material of the gate electrode 11 may include tungsten formed by ALD or CVD.

In some embodiments, the ferroelectric layer 12 is formed through one or more deposition operations selected from CVD (such as, plasma enhanced CVD and laser-assisted CVD), ALD and PVD (such as, sputtering and e-beam evaporation). In some embodiments, the ferroelectric layer 12 may be annealed by a rapid thermal annealing (RTA) operation in ambient nitrogen gas under around 400-800° C. for 1-60 minutes to obtain better ferroelectric properties.

Figure 3B:
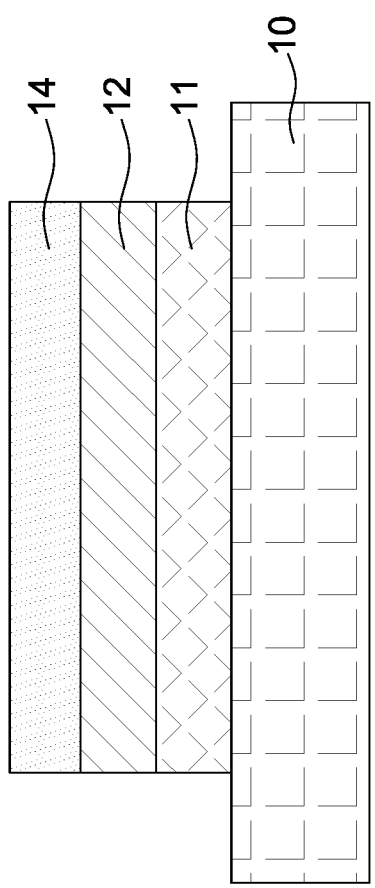

Referring to FIG. 3B, a channel layer 14 is deposited and patterned on the ferroelectric layer 12. The channel layer 14 may be an n-type channel layer. In some embodiments, the channel layer 14 may be formed by ALD, CVD, PVD (such as sputtering) or any other suitable methods. The patterned operation may include a lithographic operation and an etching operation. The etching operation may be wet etching or dry etching. The thickness of the channel layer 14 may be in a range from about 5 nm to about 30 nm. The thickness of the channel layer 14 may be adjusted depending on design requirements.

Figure 3C:
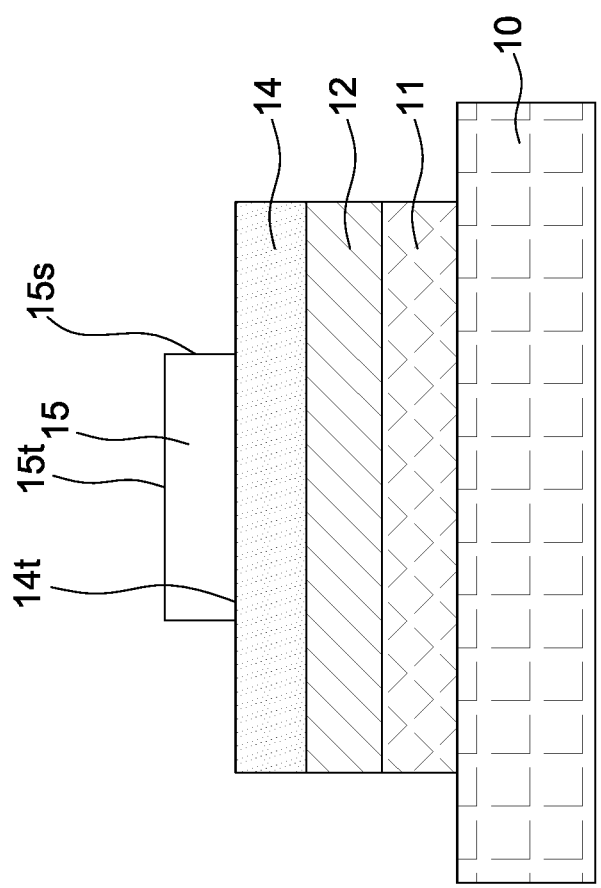

Referring to FIG. 3C, an interlayer dielectric (ILD) deposition is performed to form a protection layer 15 on the channel layer 14. A portion of the channel layer 14 is exposed from the protection layer 15. The protection layer 15 defines formation regions on the channel layer 14 for a source region and a drain region. The protection layer 15 includes a top surface 15$t$ and a lateral surface 15$s$ connected to the top surface 15$t$. The protection layer 15 may include silicon oxide, silicon nitride, silicon oxynitride, or a low-k dielectric material.

Figure 3D:
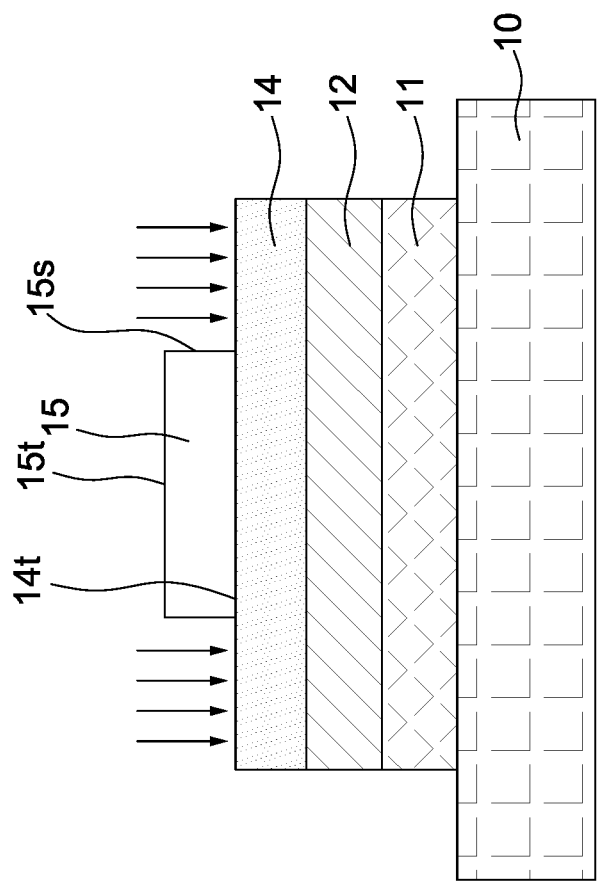

Referring to FIG. 3D, a plasma treatment is performed on the exposed portion of the channel layer 14. The protection layer 15 may act as a hard mask during the plasma treatment. Precursors of the plasma treatment may include Ar, $H_2$, or a combination thereof. The Ar/$H_2$ plasma performed on the exposed portion of the channel layer 14 may increase oxygen vacancies in the exposed portion of the channel layer 14. The power, pressure, and gas flow of the plasma treatment depend on plasma tools. The thickness of the channel layer 14 would be slightly thinned during the plasma treatment.

A carrier concentration of the exposed portion of the channel layer 14 is higher than a carrier concentration of a portion of the channel layer 14 without plasma treatment (i.e., a portion covered by the protection layer 15). The carrier concentration of the exposed portion of the channel layer 14 is in a range from approximately $10^{20}$ cm$^{-3}$ to approximately $10^{21}$ cm$^{-3}$. The carrier concentration of the portion of the channel layer 14 without plasma treatment is in a range from approximately $10^{16}$ cm$^{-3}$ to approximately $10^{17}$ cm$^{-3}$.

Figure 3E:
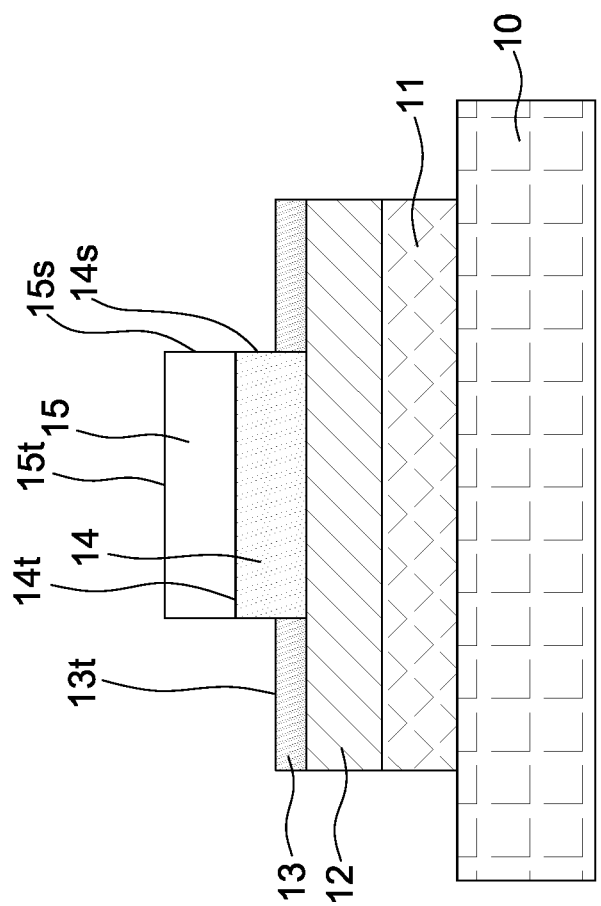

Referring to FIG. 3E, an etching operation is performed on the exposed portion of the channel layer 14 so as to form a channel layer 13. The channel layer 13 may be an n$^+$-type channel layer. A thickness of the channel layer 13 is less than a thickness of the channel layer 14. The thickness of the channel layer 13 may be in a range from about 3 nm to about 10 nm. Precursors used in the etching operation may include Ar, $H_2$, $CF_4$, $BCl_3$, or a combination thereof. A thickness of the exposed portion of the channel layer 14 is thinned during the etching operation by, such as, $CF_4$/Ar or $BCl_3$/Ar plasma. The power, pressure, and gas flow of the etching plasma depend on etching tools.

Figure 3F:
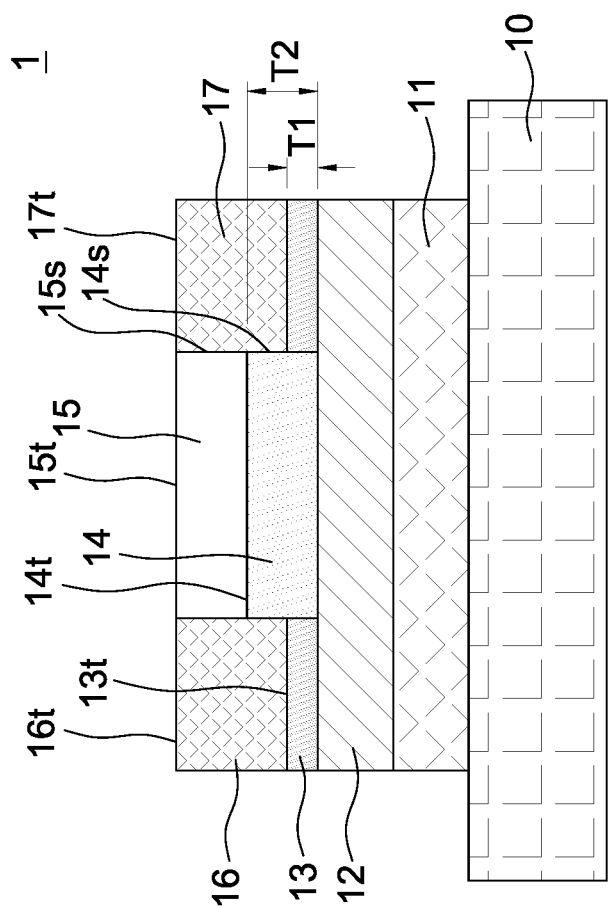

Referring to FIG. 3F, source and drain conductive materials are formed on the formation regions of the channel layer 14. A conductive material is formed on the formation regions of the channel layer 14 through one or more operations of CVD, atomic layer deposition (ALD), physical vapor deposition (PVD), plating or other suitable methods. Subsequently, a planarization operation is performed to make a top surface 16$t$ of a source region 16, a top surface 17$t$ of a drain region 17, and the top surface 15$t$ of the protection layer 15 substantially coplanar. The planarization operation may be a chemical-mechanical polishing (CMP). Accordingly, the semiconductor device 1 is completed.

The method describes an n-type channel first deposition aspect. That is, the method is directed to the formation of n-type channel layer 14 prior to the formation of the n$^+$-type channel layer 13.

FIGS. 4A through 4F illustrate some embodiments of a method of manufacturing a semiconductor device 2 according to some embodiments of the present disclosure. Various figures have been simplified to more clearly present aspects of the present disclosure.

Figure 4A:
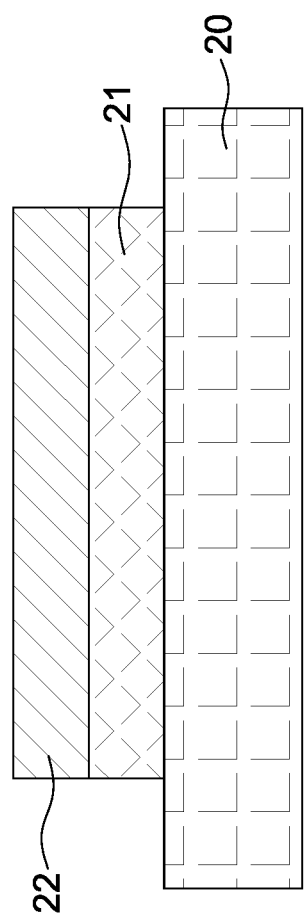
FIG. 4A to FIG. 4F illustrates a method of manufacturing a semiconductor device according to some embodiments of the present disclosure.
Figure 4B:
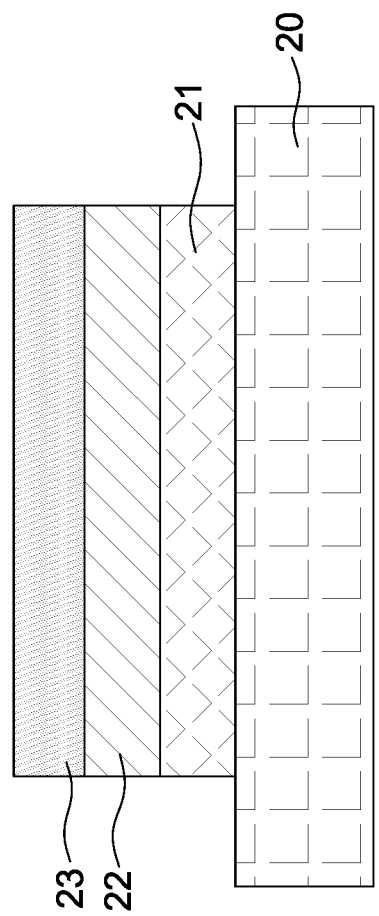

Referring to FIG. 4A and FIG. 4B, their operations are similar to those of FIG. 3A and FIG. 3B except that a channel layer 23 is formed on the ferroelectric layer 22. The characteristics of the channel layer 23 are the same as those of the channel layer 13. Accordingly, the oxygen vacancies of the channel layer 23 of FIG. 4B are greater than the oxygen vacancies of the channel layer 14 of FIG. 3B. The carrier concentration of the channel layer 23 of FIG. 4B is greater than the carrier concentration of the channel layer 14 of FIG. 3B.

Figure 4C:
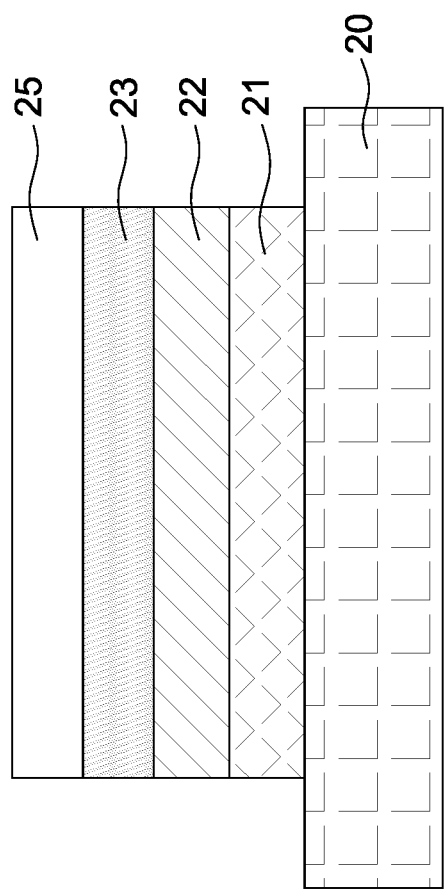

Referring to FIG. 4C, an ILD deposition is performed to form a protection layer 25 on the channel layer 23. The channel layer 23 is completely covered by the protection layer 25.

Figure 4D:
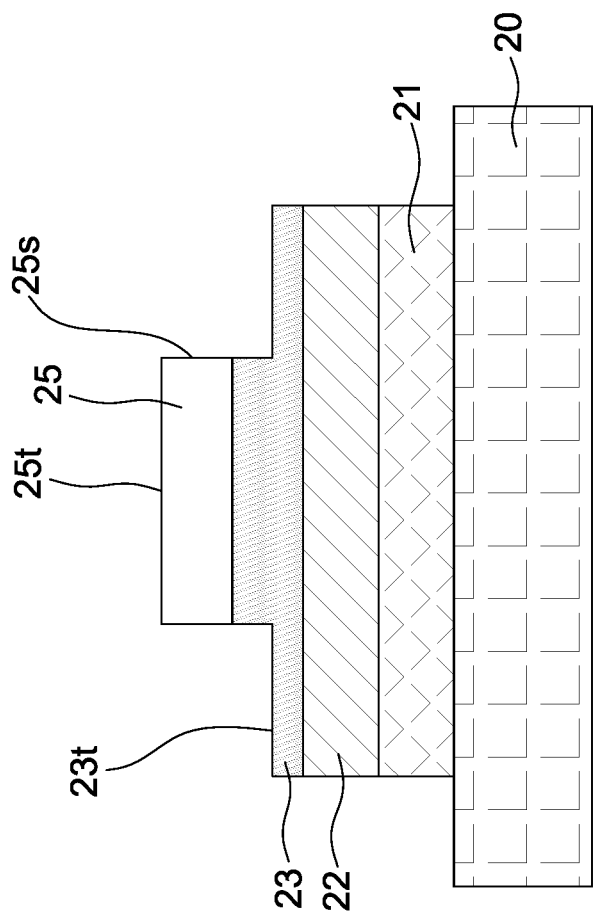

Referring to FIG. 4D, an etching operation is performed to remove a portion of the protection layer 25 and a portion of the channel layer 23 so as to form openings. The remaining portion of the protection layer 25 covers the unetched portion of the channel layer 23. The recipe of the etching operation may be similar to that of FIG. 3E. The thickness of the etched portion of the channel layer 23 may, be in a range from about 3 nm to about 10 nm.

Figure 4E:
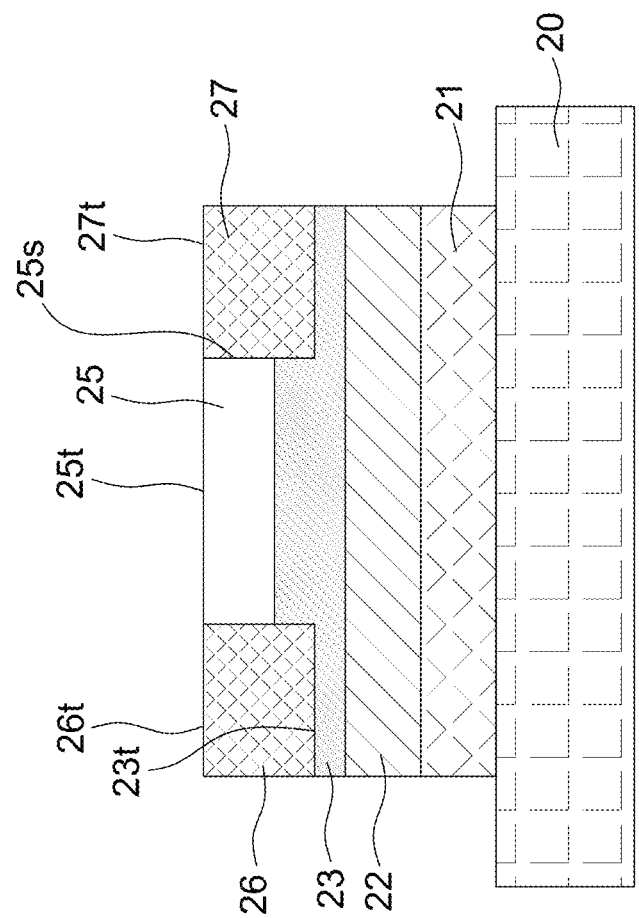

Referring to FIG. 4E, source and drain conductive materials are filled in the openings. Subsequently, a planarization operation is performed to make a top surface 26$t$ of a source region 26, a top surface 27$t$ of a drain region 27, and the top surface 25$t$ of the protection layer 25 substantially coplanar.

Figure 4F:
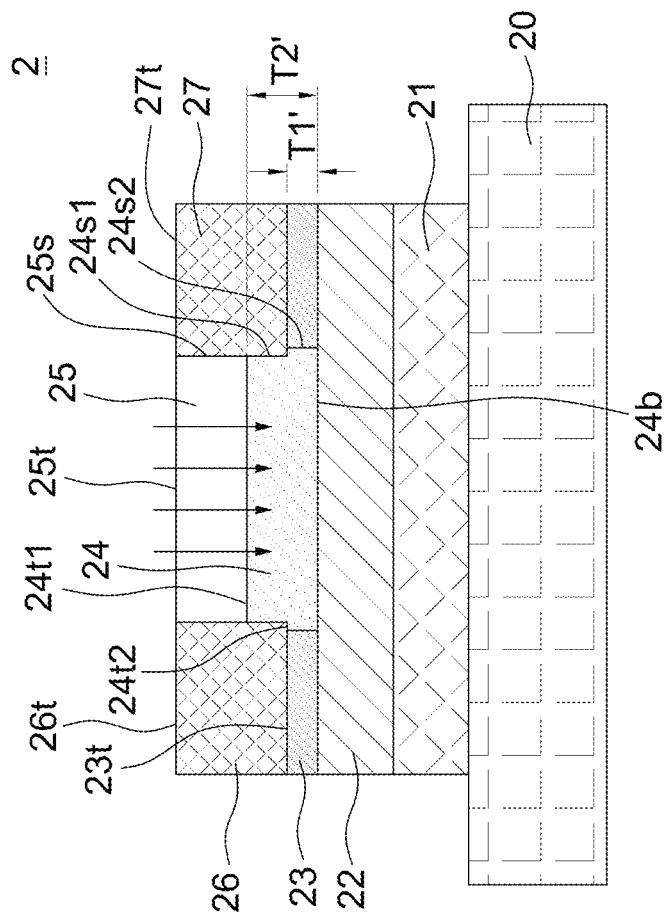

Referring to FIG. 4F, an oxygen annealing operation is performed on the unetched portion of the channel layer 23 covered by the protection layer 25. The oxygen annealing operation is performed in ambient nitrogen gas under around 300-450° C. for 30-60 minutes to form a channel layer 24. The characteristics of the channel layer 24 are the same as those of the channel layer 14.

During the oxygen annealing operation, oxygen may diffuse to an inner edge portion of the channel layer 23 under the source and drain regions 26, 27. Accordingly, a portion of the channel layer 24 is under the source and drain regions 26, 27. Accordingly, the semiconductor device 2 is completed.

The method describes an n⁺-type channel first deposition aspect. That is, the method is directed to the formation of n-type channel layer 23 prior to the formation of the n⁺-type channel layer 24.

Some embodiments of the present disclosure provide a semiconductor device. The semiconductor device comprises a gate, a ferroelectric layer disposed on the gate; a first channel layer disposed on the ferroelectric layer, a second channel layer disposed on the ferroelectric layer, and source and drain regions disposed on the first channel layer. The first channel layer includes a first thickness and the second channel layer includes a second thickness. A ratio of the first thickness and the second thickness is less than ⅗.

Some embodiments of the present disclosure provide a semiconductor device. The semiconductor device comprises a gate, a ferroelectric layer disposed on the gate; a first channel layer disposed on the ferroelectric layer, a second channel layer disposed on the ferroelectric layer, and source and drain regions disposed on the first channel layer. A carrier concentration of the first channel layer is higher than a carrier concentration of the second channel layer.

Some embodiments of the present disclosure provide a method for manufacturing a semiconductor device. The method comprises forming a gate; forming a ferroelectric layer on the gate; forming a channel layer on the ferroelectric layer; forming a dielectric layer on a first portion of the channel layer to be a hard mask, a second portion of the channel layer being exposed from the dielectric layer; thinning the second portion of the channel layer; and forming source and drain regions on the second portion of the channel layer.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a gate;
a ferroelectric layer disposed on the gate;
a first channel layer disposed on the ferroelectric layer;
a second channel layer disposed on the ferroelectric layer; and
source and drain regions disposed on the first channel layer;
wherein the first channel layer includes a first thickness and the second channel layer includes a second thickness, and a ratio of the first thickness and the second thickness is less than ⅗ and greater than ¹⁄₁₀.

2. The semiconductor device of claim 1, wherein a carrier concentration of the first channel layer is higher than a carrier concentration of the second channel layer.

3. The semiconductor device of claim 2, wherein the second channel layer is surrounded by the first channel layer.

4. The semiconductor device of claim 1, wherein the first channel layer and the second channel layer are oxide semiconductor (OS) layers.

5. The semiconductor device of claim 4, wherein a material of the first channel layer is same as a material of the second channel layer.

6. The semiconductor device of claim 5, wherein the material of the first channel layer comprises an indium-containing metal oxide semiconductor material or a gallium-containing metal oxide semiconductor material.

7. The semiconductor device of claim 5, wherein the material of the first channel layer comprises a zinc-containing metal oxide semiconductor material.

8. The semiconductor device of claim 1, wherein the ferroelectric layer comprises $HfO_2$ or $HfO_2$ doped with zirconium (Zr), silicon (Si), lanthanum (La), yttrium (Y), aluminum (Al), strontium (Sr), or germanium (Ge), or a combination thereof.

9. The semiconductor device of claim 1, wherein the second channel layer extends between the source and the drain regions.

10. The semiconductor device of claim 9, wherein the second channel layer is in contact with the first channel layer and the source and the drain regions.

11. The semiconductor device of claim 1, wherein a bottom surface of the first channel layer and a bottom surface of the second channel layer are substantially coplanar.

12. The semiconductor device of claim 1, wherein a lateral surface of the first channel layer, a lateral surface of the ferroelectric layer, a lateral surface of the source region or the drain region, and a lateral surface of the gate are substantially coplanar.

13. The semiconductor device of claim 1, wherein the second channel layer includes a step structure, and wherein a width of a top surface of the second channel layer is less than a width of a bottom surface of the second channel layer.

14. The semiconductor device of claim 1, wherein the ferroelectric layer is in contact with the first channel layer and the second channel layer.

15. A semiconductor device, comprising:
a gate;
a ferroelectric layer disposed on the gate;
a first channel layer disposed on the ferroelectric layer;
a second channel layer disposed on the ferroelectric layer; and
source and drain regions disposed on the first channel layer;
wherein a carrier concentration of the first channel layer is higher than a carrier concentration of the second channel layer,
wherein the second channel layer is laterally in contact with the first channel layer and the source and drain regions.

16. The semiconductor device of claim 15, wherein the carrier concentration of the first channel layer is in a range from approximately $10^{20}$ cm⁻³ to approximately $10^{21}$ cm⁻³.

17. The semiconductor device of claim 15, wherein the carrier concentration of the second channel layer is in a range from approximately $10^{16}$ cm⁻³ to approximately $10^{17}$ cm⁻³.

18. The semiconductor device of claim 15, wherein oxygen vacancies of the first channel layer are higher than oxygen vacancies of the second channel layer.

19. A method for manufacturing a semiconductor device, comprising:
   forming a gate;
   forming a ferroelectric layer on the gate;
   forming a channel layer on the ferroelectric layer;
   forming a dielectric layer on a first portion of the channel layer to be a hard mask, a second portion of the channel layer being exposed from the dielectric layer;
   thinning the second portion of the channel layer; and
   forming source and drain regions on the second portion of the channel layer.

20. The method of claim 19,
   wherein a plasma treatment is performed to the second portion of the channel layer prior to the thinning operation, and
   wherein a carrier concentration of the second portion of the channel layer is higher than a carrier concentration of the first portion of the channel layer.

21. The method of claim 19,
   wherein an oxygen annealing treatment is performed to the first portion of the channel layer after the formation of the source and drain regions, and
   wherein a carrier concentration of the second portion of the channel layer is higher than a carrier concentration of the first portion of the channel layer.

* * * * *